United States Patent [19]

Yamazaki

[11] Patent Number: 5,300,951
[45] Date of Patent: Apr. 5, 1994

[54] MEMBER COATED WITH CERAMIC MATERIAL AND METHOD OF MANUFACTURING THE SAME

[75] Inventor: Mutsuki Yamazaki, Yokohama, Japan

[73] Assignee: Kabushiki Kaisha Toshiba, Kawasaki, Japan

[21] Appl. No.: 64,749

[22] Filed: May 18, 1993

Related U.S. Application Data

[63] Continuation of Ser. No. 718,901, Jun. 24, 1991, abandoned, which is a continuation of Ser. No. 240,375, Sep. 1, 1988, abandoned, which is a continuation of Ser. No. 934,792, Nov. 25, 1986, abandoned.

[30] Foreign Application Priority Data

Nov. 28, 1985 [JP] Japan ............... 60-267745
Nov. 28, 1985 [JP] Japan ............... 60-267748
Nov. 28, 1985 [JP] Japan ............... 60-267749

[51] Int. Cl.$^5$ ............................ C23C 11/00
[52] U.S. Cl. .................... 346/1.1; 346/108; 346/145; 428/446; 428/469; 428/472; 428/697; 428/698; 428/701; 428/702; 427/577; 427/578; 427/579; 427/249
[58] Field of Search ............ 346/145, 108, 1.1; 428/446, 698, 472, 408, 457, 697, 701, 702, 704, 469; 427/576, 577, 578, 579, 245, 255.1, 255.2, 255.3

[56] References Cited

U.S. PATENT DOCUMENTS

| | | | |
|---|---|---|---|
| 3,189,477 | 6/1965 | Shaffer | 428/698 X |
| 3,317,356 | 5/1967 | Clendinning | 148/13.1 |
| 3,684,585 | 8/1972 | Stroup et al. | 148/6 |
| 3,771,976 | 11/1973 | Wakefield | 428/698 X |
| 3,804,034 | 4/1974 | Stiglich, Jr. | 428/698 X |
| 3,816,288 | 6/1974 | Lubicz et al. | 430/128 |
| 3,959,557 | 5/1976 | Berry | 428/698 X |
| 3,964,937 | 6/1976 | Post et al. | 428/698 X |
| 4,055,451 | 10/1977 | Cockbain et al. | 428/698 X |
| 4,158,717 | 6/1979 | Nelson | 428/446 |
| 4,239,819 | 12/1980 | Holzl | 428/469 |
| 4,289,822 | 9/1981 | Shimada et al. | 428/450 |
| 4,414,319 | 11/1983 | Shirai et al. | 430/65 |
| 4,461,820 | 7/1984 | Shirai et al. | 430/65 |
| 4,464,451 | 8/1984 | Shirai et al. | 430/65 |
| 4,477,549 | 10/1984 | Fujimaki et al. | 430/66 |
| 4,486,521 | 12/1984 | Misumi et al. | 430/65 |
| 4,489,149 | 12/1984 | Kawamura et al. | 430/65 |
| 4,490,453 | 12/1984 | Shirai et al. | 430/65 |
| 4,500,564 | 2/1985 | Enomoto | 514/781 |
| 4,540,636 | 9/1985 | MacIver et al. | 148/4 |
| 4,568,614 | 2/1986 | Eichen et al. | 428/450 |
| 4,592,958 | 6/1986 | Mosser et al. | 428/432 |
| 4,629,662 | 12/1986 | Brownlow et al. | 428/432 |
| 4,643,951 | 2/1987 | Keem et al. | 428/699 |
| 4,647,494 | 3/1987 | Meyerson et al. | 428/446 |
| 4,668,365 | 5/1987 | Foster et al. | 428/698 |
| 4,675,206 | 6/1987 | Ikegaya et al. | 427/38 |
| 4,734,339 | 3/1988 | Schachner et al. | 428/472 |

FOREIGN PATENT DOCUMENTS

| | | |
|---|---|---|
| 0064884 | 11/1982 | European Pat. Off. . |
| 2944301 | 5/1981 | Fed. Rep. of Germany . |
| 58-64377 | 4/1983 | Japan . |
| 60-17065 | 1/1985 | Japan . |
| 60-56061 | 4/1985 | Japan . |
| 644404 | 7/1984 | Switzerland . |
| 2107742 | 6/1982 | United Kingdom . |
| 2104054 | 8/1982 | United Kingdom . |

OTHER PUBLICATIONS

Chemical Abstracts, vol. 89, No. 22, Nov. 1978, pp. 252, No. 184069w.

*Primary Examiner*—A. A. Turner
*Attorney, Agent, or Firm*—Foley & Lardner

[57] ABSTRACT

A support containing iron as a major constituent is plasma-treated in an Ar-gas atmosphere containing carbon gas, to form a region on the main surface of the support. This region contains carbon at a high concentration. A plasma is generated in an Si- and N-containing gas atmosphere, to form an SiN ceramic layer on the main surface. The ceramic layer is placed contact with a rich carbon region on the surface of the support. The ceramic layer is firmly adhered to the support, by means of this region.

8 Claims, 4 Drawing Sheets

F I G. 4
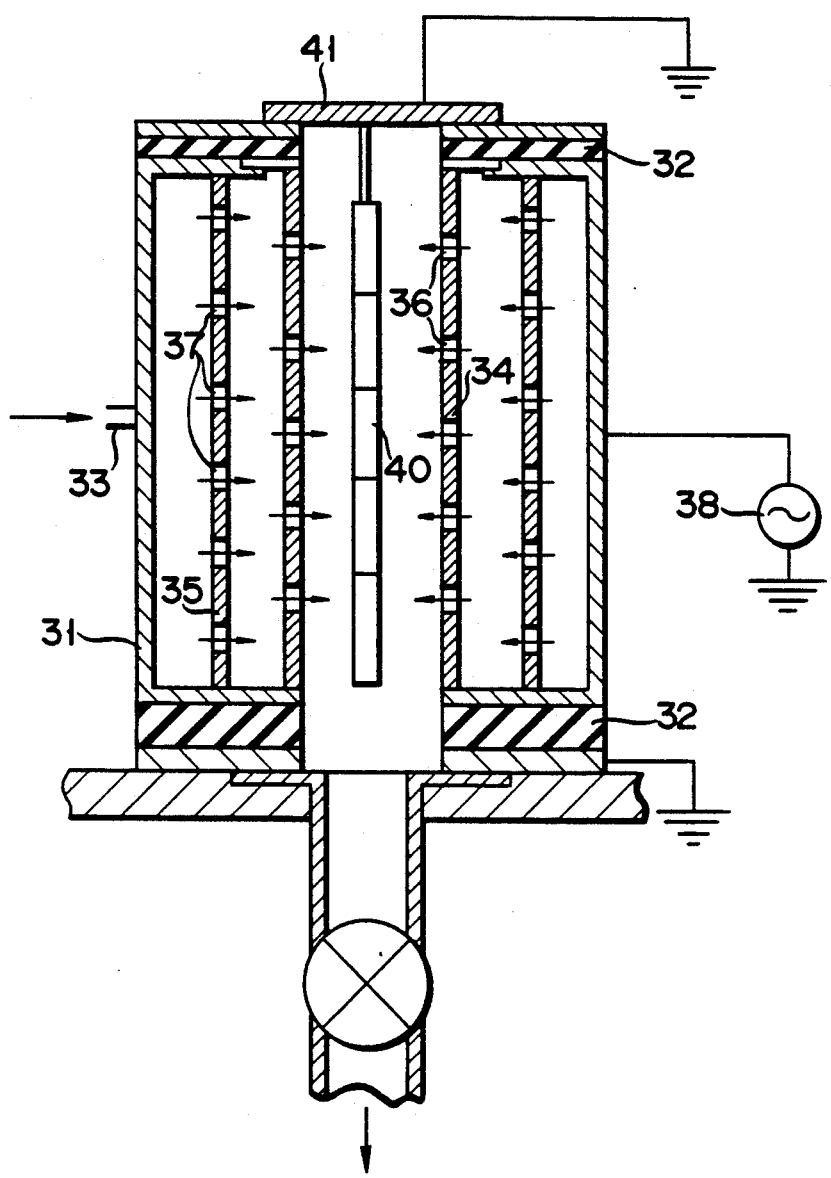

MEMBER COATED WITH CERAMIC MATERIAL AND METHOD OF MANUFACTURING THE SAME

This application is a continuation of application Ser. No. 07/718,901, filed Jun. 24, 1991, which is a continuation of Ser. No. 07/240,375, filed Sept. 1, 1988, which is a continuation of Ser. No. 06/934,792, filed Nov. 25, 1986, all now abandoned.

BACKGROUND OF THE INVENTION

The present invention relates to a member coated with a ceramic material suitable as a member which rotates at high-speed, and a method of manufacturing the same.

A member which slidingly rotates at high speed, such as a compressor shaft, an engine cam shaft, a laser scanner in a laser printer, a guide rod in a printer, etc., tends to wear easily. When wear occurs in such a fast-rotating member, this degrades the overall performance and shortens the service life of the entire apparatus. For this reason, a hard, anti-wear material such as high-speed steel or super hard alloy is often used for a member which slidingly rotates at high-speed. However, since such a material involves high material and processing costs, an increase in the total cost of the apparatus is thus inevitable. In order to decrease the total cost, a relatively inexpensive material such as cast iron or free-machining steel is sometimes used, and the surface thereof is hardend or smoothened. A technique for forming a hard ceramic such as TiN or TiC, to improve the anti-wear property of a cutting tool, has been proposed.

However, surface-hardening treatment is often performed by means of quenching, and a smoothening treatment is often performed by means of a tuftride treatment, a perco treatment, or black molybdenum disulfide coating. Neither finishing treatment can impart to the treated member satisfactory durability against the stress of use at a high load and high speed.

The tuftride treatment and quenching both require a treatment temperature as high as 500° C., and the base material may become deformed, as a result. If a member requires high dimensional precision, these treatments cannot then be used.

If a TiN or TiC film is formed on a member designed for slidingly rotating at high speed, the mated sliding member becomes worn, since the TiN or TiC film is harder than the material of the mated member. Worn metal chips become attached to the ceramic layer and caused to be baked on the layer.

SUMMARY OF THE INVENTION

It is an object of the present invention to provide a member coated with a ceramic material which has a high adhesion with a base material, and which possesses good anti-wear properties, does not cause wear in a mated sliding member, which prevents baking of the worn-out chips, and a method of manufacturing the same.

A member coated with a ceramic material according to the present invention comprises:

a metallic support having a surface and a region containing at least one element selected from the group consisting of carbon, oxygen, and nitrogen at a concentration higher than that of other region in said outer surface; and a ceramic layer coated on said surface of said support.

A method of manufacturing a member coated with a ceramic material comprises the steps of:

forming a region on the main surface of a metallic support containing at least one element selected from the group consisting of carbon, oxygen, and nitrogen, upon generation of a plasma in an argon-containing gas atmosphere, said region containing said at least one element at a concentration higher than that of other region in said surface; and forming a ceramic layer on said outer surface of said support.

The inventor of the present application has made extensive studies on the development of ceramic materials which have high hardness and good anti-wear properties, and which prevent a mated sliding member from becoming worn. The inventor found that ceramic materials containing an element of Group III of the Periodic Table, for example, silicon or boron as a major constituent, satisfied the above requirements. Such a ceramic material can be deposited on a support or a base material, by sputtering, by plasma CVD, or by ion plating. In addition, the heat treatment temperature can be as relatively low as 200° to 300° C., and deformation of the base material during the treatment can therefore be limited. As a result, such a material can be formed as a coating on a member requiring high dimensional precision.

However, this ceramic material has poor adhesion properties in relation to the support or base material, as compared to TiN and TiC. In particular, if the base material is cast iron, for a compressor shaft or the like, it is difficult, in practice, to form such a ceramic layer thereon.

The present inventor repeated various experiments, with the purpose of easily forming a stable ceramic layer on a support containing iron as a major constituent. He found that such a ceramic layer could be formed on the support when a high oxygen or nitrogen concentration region was formed on the surface of the support. The present invention has been developed on the basis of such experimental results.

Examples of ceramic materials which have high anti-wear properties and which can prevent a mated sliding member from becoming worn, are silicon nitride (SiN), boron nitride (BN), silicon carbide (SiC), boron carbide (BC), silicon oxide (SiO), silicon carbonitride ($SiC_XN_Y$), boron carbonitride ($BC_XN_Y$), and silicon carbooxide ($SiC_XO_Y$). For example, SiN and SiO have a Vickers' hardness of 1,800 to 2,000 Hv; SiC, 2,000 to 2,500 Hv; and BN, 2,500 to 3,000 Hv. These ceramic materials have high hardness and good anti-wear properties. At the same time, the mated sliding member can be made of an iron-based material, and not become worn out. The ceramic layer can be formed by sputtering, ion plating, plasma CVD, thermal CVD, photo CVD, or the like. Plasma CVD is most preferable in consideration of adhesion to the support and with respect to facilitating use of a lower-temperature heat treatment.

BRIEF DESCRIPTION OF THE DRAWINGS

FIGS. 2 to 4 are longitudinal sectional views showing an apparatus for manufacturing a member coated with the ceramic layer.

DETAILED DESCRIPTION OF THE PREFERRED EMBODIMENTS

Figure 1:
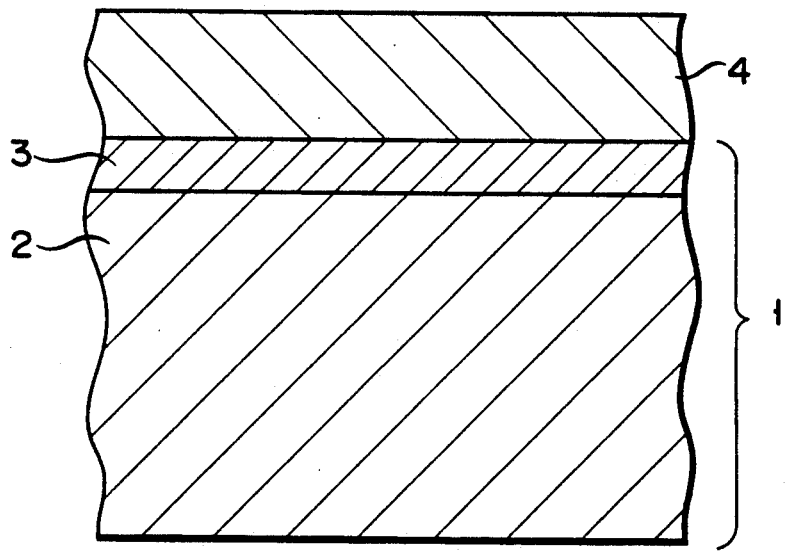
FIG. 1 is a sectional view of a member coated with a ceramic material, according to an embodiment of the present invention.

Preferred embodiments of the present invention will now be described with reference to the accompanying drawings. As is shown in FIG. 1, a member coated with a ceramic material according to an embodiment of the present invention has ceramic layer 4 formed on the main surface of metallic support 1. Support 1 has bulk 2 and region 3 formed at the main surface of support 1.

Region 3 contains at least one element selected from the group consisting of carbon, oxygen, and nitrogen at a concentration higher than that of bulk 2.

After layer 3 is formed at the surface of support 1, ceramic layer 4 is formed thereon, so that layer 4 is formed on support 1, with good adhesion therebetween.

Support 1 contains iron as a major constituent and at least one element selected from the group consisting of nickel, chromium, aluminum, manganese, magnesium, and vanadium. An additive such as nickel is used for accelerating oxidation or nitrization when layer 3 is formed on support 1.

Ceramic layer 4 contains silicon or an element (e.g., boron) belonging to Group III of the Periodic Table, as a major constituent. In the process of forming such a ceramic layer, hydrogen or halogen atoms are contained in the ceramic layer. If 20 atm.% or less of such atoms are contained, the content does not adversely affect the anti-wear properties of the ceramic layer.

A method of manufacturing the member coated with the ceramic layer according to this embodiment will now be described below.

A cast iron or free-machining steel block is used to machine a member of a predetermined shape, such as a rotary compressor shaft or a printer carriage guide, to obtain a base material. The base material surface is treated in an Ar gas plasma. Thereafter, a ceramic material such as SiN is coated on the surface of the base material. The result is a shaft or carriage guide, made mainly of iron, whose surface is now coated with SiN or the like. Because of this coating, even if a mated sliding member is in high-speed sliding contact with a shaft or guide composed of such a base material, the mated sliding member will not become worn out.

Figure 2:
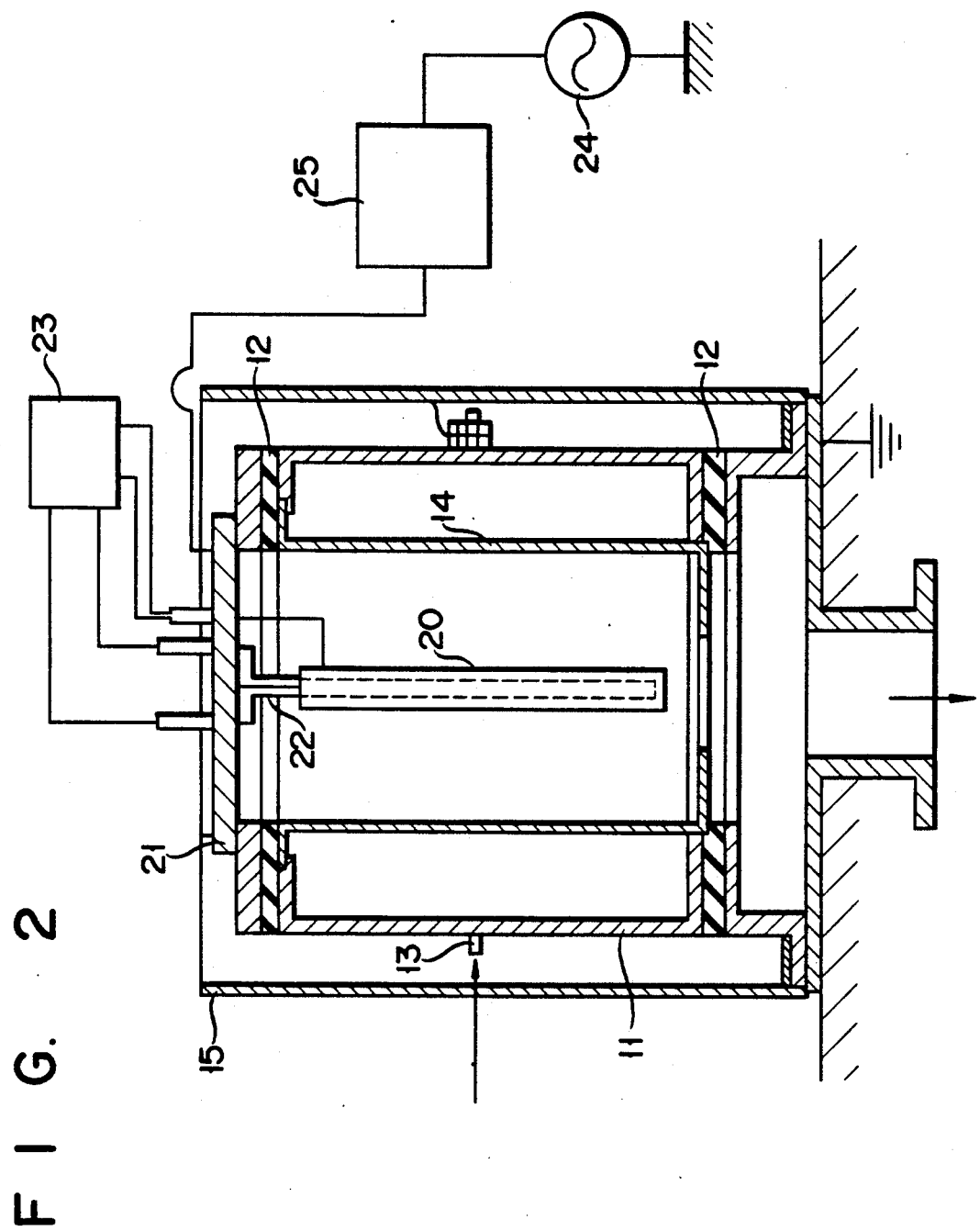
Figure 3:
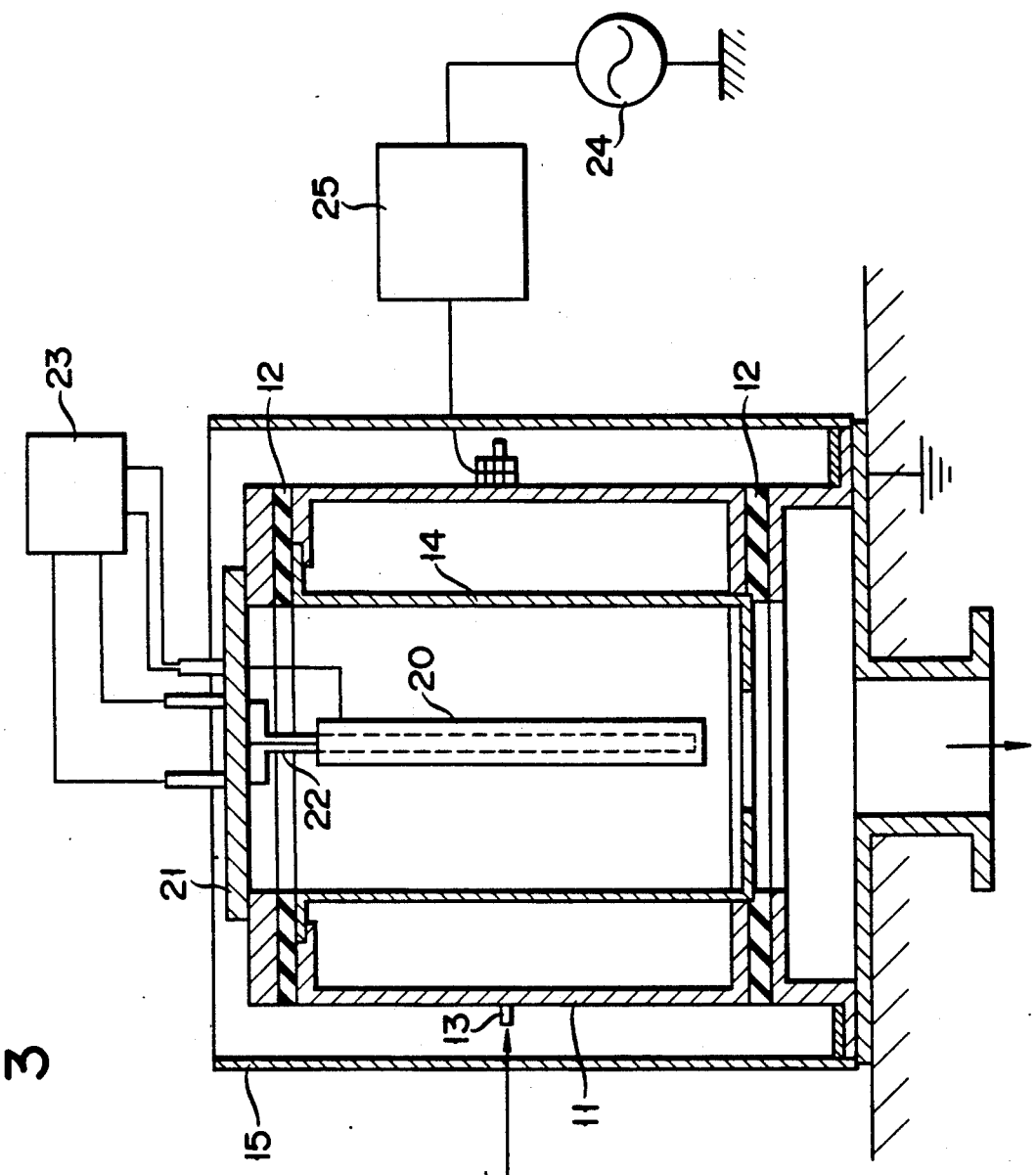

A method of manufacturing the member with the ceramic layer, by plasma CVD, will now be described with reference to FIGS. 2 and 3.

Cylindrical reaction chamber 11 is supported such that the axial direction of chamber 11 extends vertically. Chamber 11 is electrically insulated from the earth by means of insulating member 12. Chamber 11 is evacuated by a mechanical booster pump or a hydraulic rotary pump (not shown) and is kept at a vacuum of $10^{-3}$ torr.

Various source gases can be supplied to chamber 11, through gas supply port 13. Cylindrical electrode 14 is coaxially arranged in chamber 11 and is kept at the same potential as that thereof. A plurality of gas apertures (not shown) are formed in electrode 14. Gas supplied to chamber 11 through port 13 is supplied substantially uniformly to the center of chamber 11, by means of the gas apertures in electrode 14. Cylindrical shield 15 is grounded and is arranged to surround chamber 11.

Cylindrical base material 20 as a support for a ceramic layer is situated at the center of chamber 11 such that the axial direction of material 20 extends vertically. Support member 21 is placed as an upper cover of chamber 11, with insulating member 12 sandwiched between member 21 and chamber 11. Base material 20 is suspended from support member 21 and is inserted in chamber 11. Heater 22, made of a resistor heater, is inserted in the center of material 20 along its longitudinal direction. Heater 22 is connected to power source 23. Power is supplied from power source 23 to heater 22, to heat base material 20. Referring to FIG. 2, base material 20 and support member 21 are connected to RF power source 24 via matching circuit 25. Referring to FIG. 3, circuit 25 is connected to chamber 11, so that RF power can be applied thereto. As is shown in FIGS. 2 and 3, RF power is applied to base material 20 or chamber 11, so that a plasma discharge occurs therebetween.

With the above arrangement, the surface of the base material is plasma-treated in an Ar-containing gas atmosphere. More specifically, as is shown in FIG. 2, matching circuit 25 is connected to support member 21, and chamber 11 is evacuated to a vacuum of about $10^{-3}$ torr. Evacuation of chamber 11 continues, and at the same time, Ar gas at a flow rate of 200 SCCM is supplied to chamber 11, through port 13. In this case, the interior of chamber 11 is controlled at a pressure of 1 torr. Power is then supplied from power source 23 to heater 22, to thereby heat base material 20 at a temperature of 150° to 300° C. Thereafter, RF power of 300 W is applied to base material 20, to generate a plasma between electrode 14 and base material 20. The plasma generation time is about 30 minutes. In this case, the treatment gas may be Ar gas only, or a mixture of Ar gas and $H_2$, He, or $N_2$ gas.

In the above embodiment, the base material may be preheated. However, when a plasma is generated, the base material is heated by the plasma. Therefore, the special heater may be dispensed with altogether. In this case, RF power applied to base material 20 may be increased or the treatment time may be prolonged.

After the plasma treatment, a gas containing a ceramic element to be coated on the base material, is supplied to chamber 11. The ceramic material is coated on the plasma-treated surface of the base material. If a ceramic material contains Si as a major constituent, an Si-containing gas, such as $SiH_4$ or $Si_2H_6$ gas is mixed with a gas containing N, such as $N_2$ or $NH_3$ gas for a nitride ceramic material; the Si-containing gas is mixed with a gas containing C, such as $CH_4$ or $C_2H_6$ for a carbide ceramic material; and the Si-containing gas is mixed with a gas containing O, such as $O_2$ or $N_2O$ gas for an oxide ceramic material. If a ceramic material to be coated contains B as a major constituent, the Si-containing gas is replaced by a B-containing gas such as $BF_3$ or $B_2H_6$ gas. Such a source gas is supplied to chamber 11, and at the same time, the connection of matching circuit 25 to support member 21 is switched to chamber 11. The connection of shield 15 to chamber 11 is switched to support member 21. RF power is supplied from RF power source 24 to chamber 11 and electrode 14, to generate a plasma between electrode 14 and material 20. The ceramic material containing the constituting element in the source gas, is coated on the surface of material 20.

Typical examples of the coating conditions and the thicknesses of the ceramic layers are:

(a) SiN layer
 SiH$_4$ gas flow rate: 50 SCCM
 N$_2$ gas flow rate: 800 SCCM
 Reaction pressure: 1.0 torr
 RF power: 300 W Film formation time: 1 hour
Film thickness: about 4 μm
(b) SiC layer
SiH$_4$ gas flow rate: 50 SCCM
CH$_4$ gas flow rate: 300 SCCM
Reaction pressure: 1.0 torr
RF power: 300 W
Film formation time: 1 hour
Film thickness: about 4 μm
(c) BN layer
B$_2$H$_6$ gas flow rate: 50 SCCM
N$_2$ gas flow rate: 800 SCCM
Reaction pressure: 1.0 torr
RF power: 300 W
Film formation time: 1 hour
Film thickness: about 4 μm
(d) SiO layer
SiH$_4$ gas flow rate: 50 SCCM
O$_2$ gas flow rate: 300 SCCM
Reaction pressure: 1.0 torr
RF power: 300 W
Film formation time: 1 hour
Film thickness: about 4 μm The members coated with the ceramic layers have high ceramic adhesion rigidity and good anti-wear properties. Rotary compressor shafts were manufactured using the respective films, under the conditions described above. A durability test for 1,000 hours was conducted such that these shafts were continuously rotated at 10,000 rpm for 30 minutes, stopped for 10 minutes, and then continuously rotated again at 10,000 rpm for 30 minutes. The shafts coated with layers (a) to (d) did not cause baking due to wear, nor did they peel away from the base materials, thus proving that they possess the required high durability.

In the above embodiment, the treatment of the base material surface and the ceramic coating are performed by plasma CVD. However, sputtering, ion plating, thermal CVD, or photo CVD may be used in place of plasma CVD. In addition, the plasma generation power is not limited to RF power but can be extended to DC power. In this case, the matching circuit can be eliminated.

The SiN, SiC, SiO, or BN ceramic layer is normally amorphous but may be polycrystalline, partially crystallized, or have a local microcrystal region. However, in any case, the resultant film possesses good anti-wear properties.

Another method of manufacturing a material coated with a ceramic layer, by plasma CVD, according to another embodiment of the present invention, will now be described with reference to FIG. 4. Cylindrical reaction chamber 31 is supported such that the axial direction of chamber 31 extends vertically. Chamber 31 is electrically insulated from earth, by means of insulating member 32. Chamber 31 is evacuated, by a mechanical booster pump or a hydraulic rotary pump (not shown), to a vacuum of about $10^{-3}$ torr. Various types of source gases can be supplied to chamber 31, through gas supply port 33. Cylindrical electrode 34 is coaxially arranged in chamber 31. Cylindrical diffusion member 35 is coaxial with electrode 34, between electrode 34 and the wall surface of chamber 31. A plurality of gas apertures 36 and 37 are respectively formed in electrode 34 and diffusion member 35. Gas supplied to reaction chamber 31 through port 33 is supplied to the center of chamber 31 through apertures 37 of diffusion member 35 and apertures 36 of electrode 34, thereby uniformly diffusing the gas to the center of chamber 31. Electrode 34 and diffusion member 35 are kept at the same potential as that of chamber 31. Electrode 34 is connected to RF power source 38, in order to receive RF power.

Cylindrical metallic support 40 is situated at the center of chamber 31 such that the axial direction of support 40 extends vertically. Support member 41 serves as an upper cover of reaction chamber 31, with insulating member 32 sandwiched between member 41 and chamber 31, and member 41 is grounded. Support 40 is suspended from support member 41 and is inserted in chamber 31. Since support 40 is also grounded, as is support member 41, upon application of RF power from RF power source 38 to electrode 34, a plasma discharge occurs between electrode 34 and support 40.

With the arrangement described above, the surface of the metallic support is carbonized to form a surface region containing carbon at a high concentration. More specifically, after the interior of chamber 31 is evacuated to a vacuum of $10^{-3}$ torr and then continuously evacuated, CF$_4$ or CH$_4$ gas is supplied to chamber 31, through port 33, and the pressure of chamber 31 is controlled at a pressure of 1 torr. Subsequently, when RF power is supplied between electrode 34 and support 40, to generate a plasma, the surface of support 40 is carbonized. In this case, if a gas containing only carbon is used to generate a plasma, a film formed upon polymerization of carbon atoms, by means of a plasma, tends to be formed on the surface of the support 40. If this film is soft, the ceramic layer to be formed in the subsequent process tends to undesirably peel away from the support. For this reason, in addition to a gas containing carbon, a gas such as Ar, He, or N$_2$ gas is used to obtain a gas mixture, so as to generate a plasma. By using such a gas mixture, carbon polymerization can be prevented, and a reaction between carbon and iron tends to occur easily. The gas to be mixed with carbon gas is preferably Ar gas, since it is inert and has high ionization energy. Typical carbonization conditions are as follows:

CH$_4$ gas flow rate: 50 SCCM
Ar gas flow rate: 300 SCCM
Reaction pressure (vaccum): 1.0 torr
RF power: 500 W
Treatment time: 30 minutes In this carbonization process, the metallic support may be preheated. However, if the plasma is generated, it heats the metallic support. Therefore, a special heater may not be required. A carbon source is not limited to a gas; it can be a solid material. In this case, carbon atoms are sputtered by Ar plasma from the solid containing carbon.

After the carbonization process is completed, a gas containing a constituting element of the ceramic to be coated, is supplied to chamber 31, thereby forming a ceramic material on the carbonized surface of the base material. If a ceramic material to be coated contains Si as a major constituent, an Si-containing gas, such as SiH$_4$ or Si$_2$H$_6$ gas, is mixed with an N-containing gas, such as N$_2$ or NH$_3$ gas for a nitride ceramic material; the Si-containing gas is mixed with a C-containing gas, such as Ch$_4$ or C$_2$H$_6$ gas for a carbide ceramic material; and the Si-containing gas is mixed with an O-containing gas, such as O$_2$ or N$_2$O gas for an oxide ceramic material. On the other hand, if a ceramic material to be coated contains B as a major constituent, the Si-containing gas is replaced by a B-containing gas, such as BF$_3$ or B$_2$H$_6$ gas. In order to form a film of SiC$_x$N$_y$, CH$_4$ gas is added to a mixture of SiH$_4$ and N$_2$ gases. In order to form a film of $SiC_xO_y$, $CH_4$ gas is added to a mixture of $SiH_4$ gas and $O_2$ or $N_2O$ gas.

Typical examples of coating conditions and thicknesses of ceramic layers formed by the above apparatus are:

(a) SiN layer
$SiH_4$ gas flow rate: 100 SCCM
$N_2$ gas flow rate: 300 SCCM
Reaction pressure: 1.0 torr
RF power: 500 W
Film formation time: 30 minutes
Film thickness: about 3 $\mu$m (b) SiC layer
$SiH_4$ gas flow rate: 100 SCCM
$CH_4$ gas flow rate: 300 SCCM
Reaction pressure: 1.0 torr
RF power: 500 W
Film formation time: 30 minutes
Film thickness: about 3 $\mu$m (c) BN layer
$BF_3$ gas flow rate: 100 SCCM
$N_2$ gas flow rate: 300 SCCM
Reaction pressure: 1.0 torr
RF power: 500 W
Film formation time: 30 minutes
Film thickness: about 3 $\mu$m (d) SiO layer
$SiH_4$ gas flow rate: 100 SCCM
$O_2$ gas flow rate: 300 SCCM
Reaction pressure: 1.0 torr
RF power: 500 W
Film formation time: 30 minutes
Film thicknesses: about 3 $\mu$m The members coated with the ceramic layers have high ceramic adhesion rigidity and good anti-wear properties. Rotary compressor shafts were manufactured using the respective films, under the conditions described above. A durability test for 1,000 hours was conducted such that these shafts were continuously rotated at 10,000 rpm for 30 minutes, stopped for 10 minutes, and then continuously rotated again at 10,000 rpm for 30 minutes. The shafts coated with layers (a) to (d) did not cause burn-out due to wear, nor did they peel away from the base materials, thus providing that they possess the required high durability.

In the above embodiment, the carbonization of the base material surface and the ceramic coating are performed by plasma CVD. However, sputtering, ion plating, or the like may be used.

According to the present invention, a ceramic layer can be strongly adhered to a metallic support containing iron as a major constituent, to thereby obtain a member possesses good anti-wear properties. This member does not wear away its mated sliding member, and thus it prevents baking.

What is claimed is:

1. In a laser printer, the combination comprising a laser scanner and a sliding shaft member for said laser scanner which slidingly rotates at high speed and comprises (a) an iron-based cylindrical shaft having a main surface with a region containing at least one element selected from the group consisting of oxygen and nitrogen at a concentration higher than that of another region in said main surface, said region being formed by treating the main surface with a plasma of a gas containing at least one element selected from the group consistent of oxygen and nitrogen, and (b) a Si atoms-containing layer formed on said main surface of said cylindrical shaft by a plasma chemical vapor deposition using Si atoms-containing raw gas, said Si atoms-containing layer formed on said main surface of said cylindrical shaft comprising a material selected from the group consisting of silicon nitride, silicon carbonitride and silicon carboxide, and containing at least one element selected from the group consisting of hydrogen and halogen.

2. A laser printer according to claim 1, wherein said iron-based cylindrical shaft is formed of iron containing at least one additive selected from the group consisting of nickel, chromium, aluminum, manganese, magnesium and vanadium.

3. A laser printer as recited in claim 1 wherein said region of said main surface of said cylindrical shaft contains oxygen at a concentration higher than that of another region in said main surface.

4. A laser printer as recited in claim 1 wherein said region of said main surface of said cylindrical shaft contains nitrogen at a concentration higher than that of another region in said main surface.

5. A method of inhibiting wear in a sliding shaft member of a laser scanner, which slidingly rotates at high speed, in a laser printer, which comprises the steps of:
    (a) exposing a main surface of an iron-based cylindrical shaft member with a plasma in an atmosphere containing at least one element selected from the group consisting of oxygen and nitrogen to form a region containing at least one element selected from the group consisting of oxygen and nitrogen at a concentration higher than that of another region in said main surface; and
    (b) forming a Si atoms-containing layer on said main surface of said cylindrical sliding shaft member by a plasma chemical vapor deposition using Si atoms-containing raw gas, said layer comprising a material selected from the group consisting of silicon nitride, silicon carbonitride and silicon carboxide, and containing at least one element selected from the group consisting of hydrogen and halogen, wherein said cylindrical sliding shaft member is preheated before step (a).

6. A method according to claim 5, wherein said cylindrical sliding shaft member is preheated at a temperature of 150° to 300° C.

7. A method of inhibiting wear in a sliding shaft member of a laser scanner in a laser printer, which comprises the steps of:
    (a) carbonizing a surface of said sliding shaft member by exposing the surface of said shaft member to RF plasma in an atmosphere containing $CF_4$ or $CH_4$ at a reduced pressure; and
    (b) forming a ceramic layer made of a material selected from the group consisting of silicon nitride, silicon carbide, silicon carbonitride and silicon carboxide, on said carbonized surface of said shaft member by plasma chemical vapor deposition in an atmosphere containing $SiH_4$ or $Si_2H_6$, and one member selected from the group consisting of $N_2$, $CH_4$ and $O_2$, wherein said cylindrical sliding shaft member is preheated before step (a).

8. A method according to claim 7, wherein said cylindrical sliding shaft member is preheated at a temperature of 150° to 300° C.

* * * * *